United States Patent [19]

Mori et al.

[11] Patent Number: 5,182,757

[45] Date of Patent: Jan. 26, 1993

[54] SURFACE EMISSION TYPE SEMICONDUCTOR LASER

[75] Inventors: Katsumi Mori; Tatsuya Asaka; Hideaki Iwano, all of Suwa, Japan

[73] Assignee: Seiko Epson Corporation, Tokyo, Japan

[21] Appl. No.: 756,981

[22] Filed: Sep. 9, 1991

[30] Foreign Application Priority Data

Sep. 12, 1990 [JP] Japan .................................. 2-242000

[51] Int. Cl.$^5$ ............................................... H01S 3/19
[52] U.S. Cl. ........................................ 372/45; 372/46; 372/50
[58] Field of Search ......................... 372/44, 45, 46, 50, 372/92

[56] References Cited

U.S. PATENT DOCUMENTS

| | | | |
|---|---|---|---|
| 4,949,351 | 8/1990 | Imanaka | 372/45 |
| 5,031,187 | 7/1991 | Orenstein | 372/50 |
| 5,045,897 | 9/1991 | Ahlgren | 372/43 |
| 5,052,016 | 9/1991 | Mahbobzadeh et al. | 372/96 |
| 5,068,868 | 11/1991 | Deppe et al. | 372/45 |
| 5,086,430 | 2/1992 | Kapon et al. | 372/45 |

FOREIGN PATENT DOCUMENTS

| | | |
|---|---|---|
| 2606223 | 5/1988 | France . |
| 61-079280 | 4/1986 | Japan . |
| 1-125990 | 5/1989 | Japan . |
| 1-266779 | 10/1989 | Japan . |

OTHER PUBLICATIONS

A. Ibaraki et al., "GaAs/GaAlAs DBR Surface Emitting Laser With GaAlAs/AlAs and S$_i$O$_2$/T$_i$O$_2$ Reflectors", Conference Digest of the 11th IEEE International Semiconductor Laser Conference, Aug. 1988, Boston, Mass., pp. 164–165.
Hoi-Jun et al., "Phase-locked two-dimensional array of vertical cavity surface emitting lasers", Japanese Journal of Applied Physics, Extended Abstracts 22th Conf. Solid State Devices and Materials, Aug. 1990, Tokyo, Japan, pp. 521–524.
M. Ogura et al. "Surface-Emitting Laser Diode with Distributed Bragg Reflector and Buried Hetrostructure", 8030 Electronics Letters 26 (1990) Jan. 4, No. 1.
Scherer et al. "Fabricaton of Electrically Pumped Vertical Cavity Microlasers", Lasers and Electro-Optics Society Annual Meeting Conference Proceedings, Oct. 17–20, 1989, pp. 289–290.
J. L. Jewell et al., "Surface-Emitting Microlasers for Photonic Switching and Interchip Connections", Optical Engineering, vol. 29, No. 3, Mar. 1990.
Lectures of the 50-th Meeting of Applied Physics in Japan (1989), vol. 3, p. 909, 29a-ZG-7, K. Furusawa et al.

*Primary Examiner*—James W. Davie
*Attorney, Agent, or Firm*—Oliff & Berridge

[57] ABSTRACT

A surface emission type semiconductor laser includes a plurality of semiconductor layers defining at least one resonator in a direction perpendicular to the semiconductor substrate of the laser, the layers including at least a cladding layer in the semiconductor layers being formed into at least one column-like semiconductor layer extending in a direction perpendicular to the semiconductor substrate, and a II–VI group compound semiconductor epitaxial layer buried around the at least one column-like semiconductor layer. If a plurality of column-like semiconductor layers are to be formed by a separation groove, these column-like semiconductor layers are separated from one another, the II–VI group compound semiconductor epitaxial layer being buried in the separation groove.

18 Claims, 12 Drawing Sheets

SURFACE EMISSION TYPE SEMICONDUCTOR LASER

BACKGROUND OF THE INVENTION

1. Field of the Invention:

The present invention relates to a surface emission type semiconductor laser adapted to emit a laser beam in a direction perpendicular to the substrate thereof and a method of making such a semiconductor laser.

Figure 12:
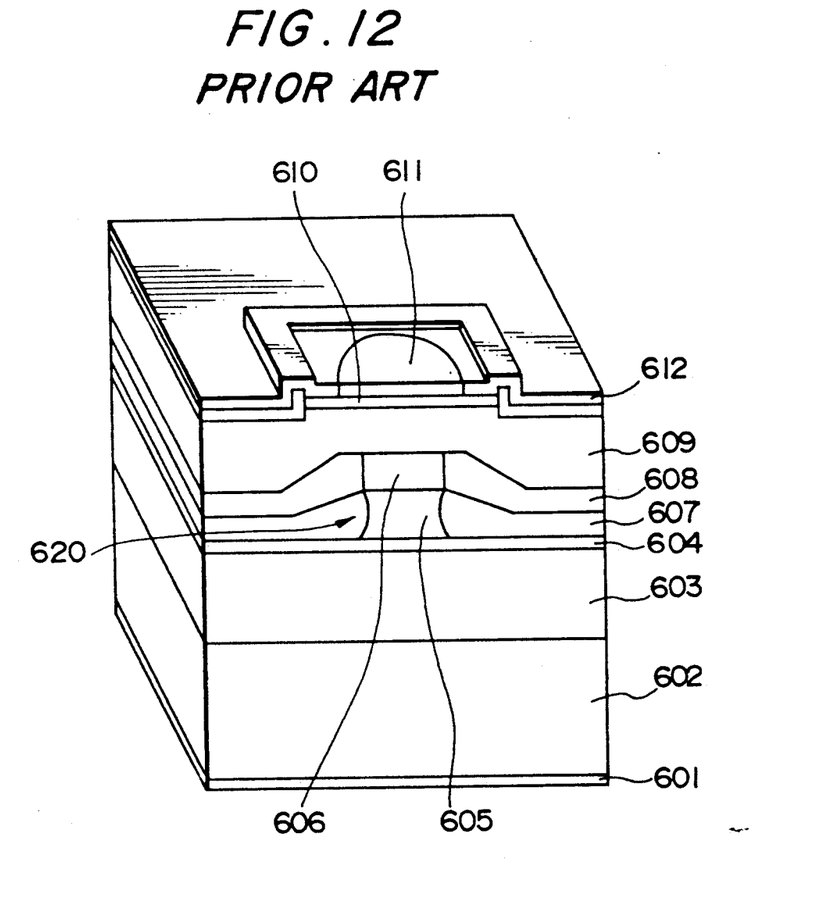
FIG. 12 is a perspective view of a surface emission type semiconductor laser constructed according to the prior art, illustrating the light emitting portion thereof.

2. Description of the Related Art:

A surface emission type laser including a resonator disposed in a direction perpendicular to the substrate thereof is disclosed in Lectures of the 50-th Meeting of Applied Physics in Japan (1989), Vol. 3, pp. 909, 29a-ZG-7. In accordance with the prior art, as shown in FIG. 12, there is first provided an n-type GaAs substrate 602 on which an n-type AlGaAs/AlAs multi-layer film 603, an n-type AlGaAs cladding layer 604, a p-type GaAs active layer 605 and a p-type AlGaAs cladding layer 606 are sequentially grown and formed. The multi-layered structure is then etched while leaving a column-like part at the top thereof. The remaining column-like part is enclosed by a buried layer which is formed by sequentially growing a p-type layer 607, n-type layer 608, p-type layer 609 and p-type layer 610 all of which are of AlGaAs in liquid phase epitaxy method. Thereafter, a multi-layer dielctric film 611 is deposited on the cap layer of p-type AlGaAs 610 at the top thereof. Finally, p- and n-type ohmic electrodes 612 and 601 are formed respectively on the top and bottom end faces of the structure thus formed. In such a manner, a surface emission type semiconductor laser will be completed.

The buried layer (607-608) formed in the above manner defines a p-n junction which is used as means for preventing current from leaking to layer sections other than the active layer section.

However, by using such a p-n junction, it is difficult to provide a sufficient current restriction; and it cannot suppress any reactive current perfectly. Due to generation of heat in the component, therefore, the surface emission type semiconductor laser constructed in accordance with the prior art is impractical in that it is difficult to perform a continuous generating drive in room temperature. It is thus important to restrict the reactive current in the surface emission type semiconductor laser.

Where the buried layer is of a multi-layered structure to form a p-n junction as in the prior art, the p-n interface in the buried layer should be positioned in consideration of a position of the interface between each of the adjacent column-like grown layers. It is difficult to control the thickness of each layer in the multi-layered structure. It is therefore very difficult to consistently produce surface emission type semiconductor lasers.

If a buried layer is formed around the column by the liquid phase epitaxy method as in the prior art, there is a high risk of breaking-off of the column-like part, leading to a reduced yield. The prior art was thus subject to a structural limitation in improving its characteristics.

The prior art raises further problems even when it is applied to various other devices such as laser printers and the like.

For example, laser printers can have an increased freedom of design as in simplifying the optical system or in decreasing the optical path, since the source of light (semiconductor laser and so on) has a relatively large size of light spot equal to several tens $\mu$m and if a light emitting element having an increased intensity of light emission is used in the laser printers.

With the surface emission type semiconductor laser constructed according to the prior art, the optical resonator is entirely buried in a material having a refractive index higher than that of the resonator. Light rays are mainly guided in the vertical direction. As a result, a spot of light emission in the basic generation mode will have a diameter equal to about 2 $\mu$m even if the shape of the resonator is modified in the horizontal direction.

It has been proposed that the light spots be located close to each other up to about 2 $\mu$m and that a plurality of light sources be used to increase the size of a spot. From the standpoint of reproductiveness and yield, however, it is very difficult with the prior art to bury a plurality of resonators spaced away from one another by several microns using the LPE method. Even if such a burying can be successfully carried out, the spots cannot be united into a single spot since the transverse leakage of light is little.

It is also necessary that a plurality of light spots are formed into a single beam of light and that the laser beams each consisted of plural spots are in phase to increase the intensity of light emission. However, the prior art could not produce a surface emission type semiconductor laser which emits a plurality of laser beams close to one another up to a distance by which one of the laser beams are influenced by the other, in order to synchronize the laser beams in phase.

SUMMARY OF THE INVENTION

It is therefore an object of the present invention to provide a high-efficiency surface emission type semiconductor laser which is of a complete current restrictable structure provided by improving the material from which the buried layer is made, and which can be produced in a very simple manner, and to provide a method of making the same.

Another object of the present invention is to provide a surface emission type semiconductor laser which includes a plurality of light emitting portions located close to one another and which can synchronize laser beams from the light emitting portions in phase and to provide a method of making the same.

Still another object of the present invention is to provide a surface emission type semiconductor laser which can emit a single laser beam formed by the in-phase laser beams from the light emitting portions, said single laser beam having a relatively large light spot and a reduced angle of radiation and to provide a method of making the same.

To this end, a surface emission type semiconductor laser for emitting a beam in a direction perpendicular to the semiconductor substrate, comprises an optical resonator including a pair of reflecting mirrors having different reflectivities and a plurality of semiconductor layers located between said reflecting mirrors, the layers including at least a cladding layer in said semiconductor layers being formed into one or more column-like semiconductor layers (portions), and a II–VI group compound semiconductor epitaxial layer buried around (surrounding) said column-like semiconductor layers. The II–VI group compound semiconductor epitaxial layer may be formed of a combination of two, three or four elements which include II-group elements such as Zn, Cd and Hg and VI-group elements such as O, S, Se and Te. It is also desirable that the lattice constant of the II–VI group compound semiconductor epitaxial layer is equal to that of the column-like semiconductor layers. It is preferred that the semiconductor layer defining the resonator is a III–V group compound semiconductor epitaxial layer of GaAs, GaAlAs, GaAsP, InGaP, InGaAsP, InGaAs, AlGaAsSb or the like.

Since the II–VI group compound semiconductor epitaxial layer has a high resistance, the buried layer formed by this high-resistance layer can prevent a leakage of incoming current thereinto. This can attain very effective current restriction. Furthermore, the threshold level of current can be decreased since the reactive current is reduced. As a result, the present invention can provide a surface emission type semiconductor laser which generates less heat and can continuously perform the generation in room temperature. Since the buried layer is not multi-layered, it can be easily formed with consistency. Furthermore, the II–VI group compound semiconductor epitaxial layer can be formed by any other suitable manner other than the liquid phase epitaxy method, such as vapor phase epitaxy method, resulting in improvement of the yeild in forming the column-like semiconductor layers. If the vapor phase epitaxy method is used, a buried layer can be reliably formed while permitting a plurality of column-like semiconductor layers to be arranged closer to one another, even if a space in which the buried layer is to be formed is small.

If the thickness of the semiconductor contact layer on the exit side of the optical resonator is equal to or less than 3.0 $\mu$m, the light absorption can be reduced in the contact layer.

If the cross-section of the column-like semiconductor layer parallel to the semiconductor substrate is circular or regular polygonal, it can provide a fairly circular spot beam. If the diameter or diagonal of the cross-section just mentioned is equal to or less than 10 $\mu$m, NFP (Near Field Pattern) mode becomes 0-order basic mode.

If the optical resonator has a single column-like semiconductor layers, the reflecting mirror on the exit side thereof may be formed at a position opposite to the end face of the column within the range of said end face. In this case, the refractive index waveguide structure may be either of rib waveguide type or buried type.

In this surface emission type semiconductor laser, the optical resonator may include separation groove(s) for separating one of the column-like semiconductor layers from another adjacent one. The II–VI group compound semiconductor epitaxial layer is buried in the separation groove and a light emitting portion is formed on each of the column-like semiconductor layers. The separation groove should not reach the active layer in the semiconductor layers defining the optical resonator. In such a manner, the respective light emitting portions are influenced by each other through the active layer, such that the lights from the light emitting portions will be in phase.

When it is desired to increase the light emission spot, a II–VI group compound semiconductor epitaxial layer which is transparent for the wavelength of the exit laser beam may be buried in the separation groove. The exit side reflecting mirror is formed through a region opposite to the end face of each of the column-like layers and the II–VI group compound semiconductor epitaxial layer buried in the separation groove. Thus, a region sandwiched between each adjacent light emitting portions also serves as a vertical resonating structure. Light leaked into such a region effectively contributes to the laser generation to increase the light emission spot in size. Since the synchronized laser beams are superimposed one over another, the light output increases and the angle of radiation decreases. With a GaAs laser generally used as a semiconductor layer of a resonator, the II–VI group compoud semiconductor epitaxial layer transparent for the wavelength of the laser beam therefrom may be made of either ZnSe, ZnS, ZnSSe, ZnCdS or CdSSe. If the separation groove is perpendicular to the semiconductor substrate, light rays slantingly entering the separation groove can be totally reflected to increase the confinement of light, utilizing a differential refraction. If the cross-section of the separation groove parallel to the semiconductor substrate has a width ranging between 0.5 $\mu$m and 10 $\mu$m, the order of the transverse generation mode measured from NFP becomes 0-order basic mode.

The present invention also provides a method of making a surface emission type semiconductor laser for emitting a laser beam in a direction perpendicular to the semiconductor substrate, comprising the steps of forming a number of semiconductor layers on the semiconductor substrate to define an optical resonator, forming a photoresist mask on said semiconductor layers, etching at least the cladding layer in said semiconductor layers by the use of said photoresist mask to form one or more column-like semiconductor layers, and forming a II–VI group compound semiconductor epitaxial layer buried around said column-like semiconductor layers in vapor phase epitaxy method.

Since the buried layer is formed by the vapor phase epitaxy method, the column-like semiconductor layers will not be deformed or damaged. It is desirable that the etching step is terminated leaving a part of the cladding layer without exposure of the active layer underlying the cladding layer. Once the active layer is exposed externally, any impurity may be deposited thereon to create a defective crystal.

If the photoresist mask used in the etching step is formed by reactive-ion etching a photoresist layer which has been hard baked, the side walls of the photoresist mask becomes perpendicular to the semiconductor substrate. When a column-like semiconductor layers are formed by the reactive-ion beam etching process using such a photoresist mask, the column-like semiconductor layers may be finely worked to have vertical side walls.

BRIEF DESCRIPTION OF THE DRAWINGS

FIGS. 8a–8d illustrate differences in shape and near field pattern between the surface emission type semiconductor laser constructed according to the prior art and the semiconductor laser of FIG. 6.

FIGS. 9(a) to (m) schematically illustrate various shapes of surface emission type semiconductor lasers constructed according to further embodiments of the present invention at the exit sides thereof.

DETAILED DESCRIPTION OF THE PREFERRED EMBODIMENTS

Figure 1:
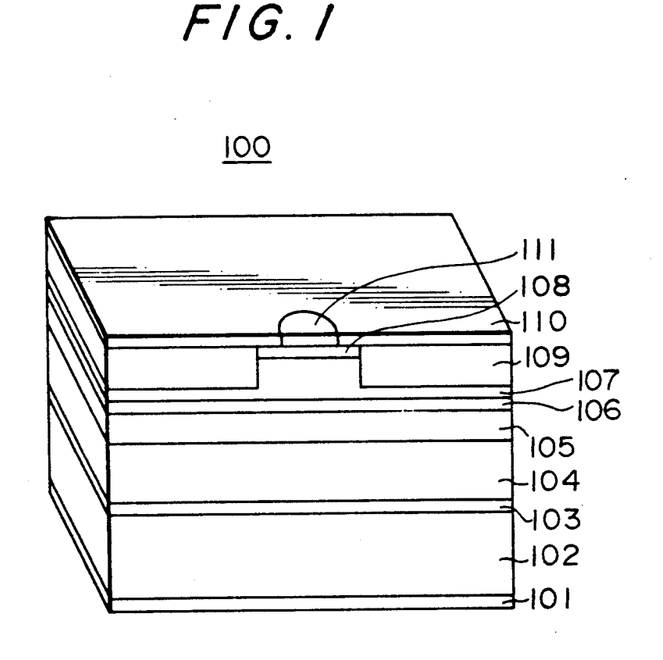
FIG. 1 is a perspective view, partially in section, of a light emitting portion of one embodiment of a semiconductor laser constructed in accordance with the present invention.

Referring to FIGS. 1 and 2, there is shown a semiconductor laser 100 constructed in accordance with one embodiment of the present invention.

The semiconductor laser 100 comprises a substrate of n-type GaAs 102 over which a buffer layer of n-type GaAs 103 is formed. Over the buffer layer 103, there are formed 30 pairs of distribution reflection type multi-layer film mirror 104 which include an n-type $Al_{0.7}Ga_{0.3}As$ layer and an n-type $Al_{0.1}Ga_{0.9}As$ layer and have a reflectivity equal to or higher than 98% against light rays having their wavelength substantially equal to 870 nm. On the multi-layer film mirror 104, there are sequentially formed a cladding layer of n-type $Al_{0.4}Ga_{0.6}As$ 105, an active layer of p-type GaAs 106, another cladding layer of p-type $Al_{0.4}Ga_{0.6}As$ 107 and a contact layer of p-type $Al_{0.1}Ga_{0.9}As$ 108, utilizing the epitaxial growth in the MOCVD process (see FIG. 2(a)). At this time, for example, the formation of these layers was carried out under such a condition that the temperature on growth is 700° C. and the pressure on growth is 150 Torr, and used organic metals such as TMGa (trimethyl gallium) and TMAl (trimethyl aluminum) as III-group materials, $AsH_3$ as V-group material, $H_2Se$ as n-type dopant and DEZn (diethyl zinc) as p-type dopant.

After growth, an $SiO_2$ layer 112 is formed on the top of the multi-layered structure by the thermal CVD process. By the use of the reactive ion beam etching process (RIBE process), the multi-layered structure is etched up to the middle of the cladding layer of p-type $Al_{0.4}Ga_{0.6}As$ 107, leaving a column-like light emitting portion covered with a hard baked resist layer 113 (FIG. 2(b)). The etching gas is a mixture of chlorine with argon under a pressure of $1 \times 10^{-3}$ Torr. The leading voltage used therein is equal to 400 V. The purpose of the etching of the cladding layer 107 up to the middle thereof is to provide a rib waveguide type refraction waveguide structure which can confine injected carriers and light rays in the active layer.

Figure 2A:
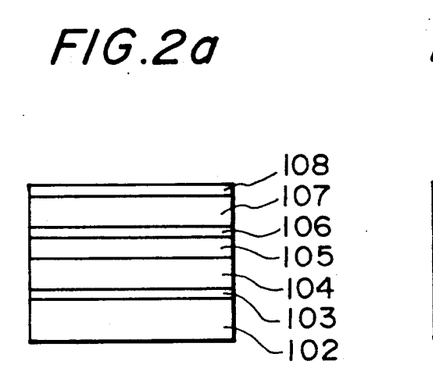
FIGS. 2a–2e are cross-sectional views of the semiconductor laser shown in FIG. 1, illustrating the process of making it.
Figure 2B:
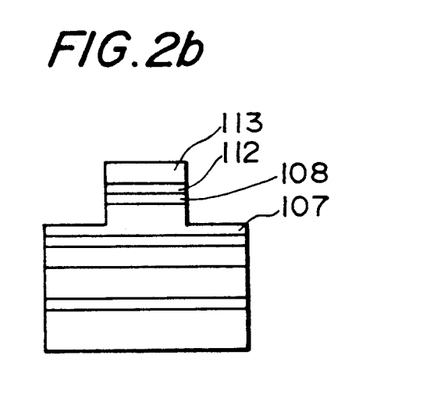
Figure 2C:
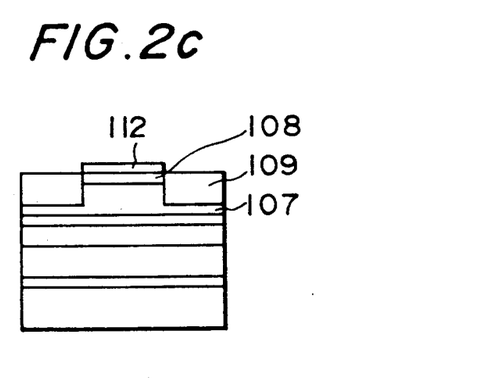
Figure 2D:
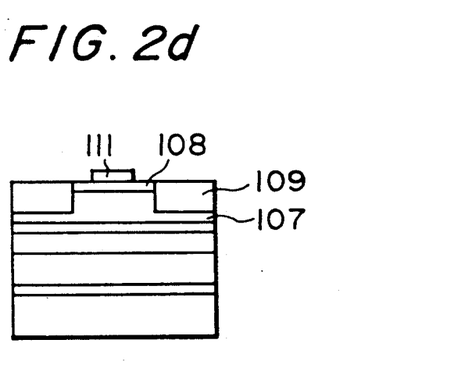
Figure 2E:
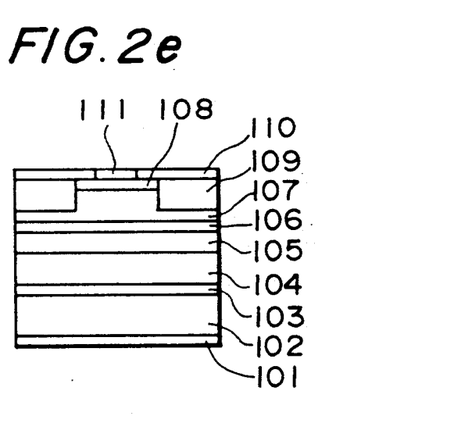

After the resist 113 has been removed, a layer of $ZnS_{0.06}Se_{0.94}$ 109 which is in lattice alignment with GaAs is then formed by causing this layer to grow around the column-like portion using the MBE or MOCVD process (FIG. 2(c)).

Four pairs of multi-layered dielectric film mirror of $SiO_2/a$-Si 111 are then formed on the top of the column-like portion by the use of electron beam deposition. Dry etching is then used to remove a part of the mirror 111, leaving a region slightly smaller than the diameter of the light emitting portion (FIG. 2(d)). The reflectivity of the multi-layered dielectric film mirror 111 is 94% for wavelength of 870 nm.

Thereafter, a p-type ohmic electrode 110 is deposited on all the top face except the multi-layered dielectric film mirror 111. An n-type ohmic electrode 101 is further deposited over the bottom face of the semiconductor substrate 102. In an atmosphere of $N_2$, the entire structure is alloyed at 420° C. to provide a surface emission type semiconductor laser (FIG. 2(e)).

The surface emission type semiconductor laser thus formed provides a very effective current restriction since the buried layer 109 of $ZnS_{0.06}Se_{0.94}$ has a resistance equal to or higher than one $G\Omega$ and there is no injection current into the buried layer. Since it is not required that the buried layer is any multi-layered structure, it can be more easily grown with an increased reproductiveness (consistency) from one batch to another. The utilization of the rib waveguide structure using the $ZnS_{0.06}Se_{0.94}$ layer having its refractive index sufficiently smaller than that of GaAs can realize a more effective light confinement.

Figure 3:
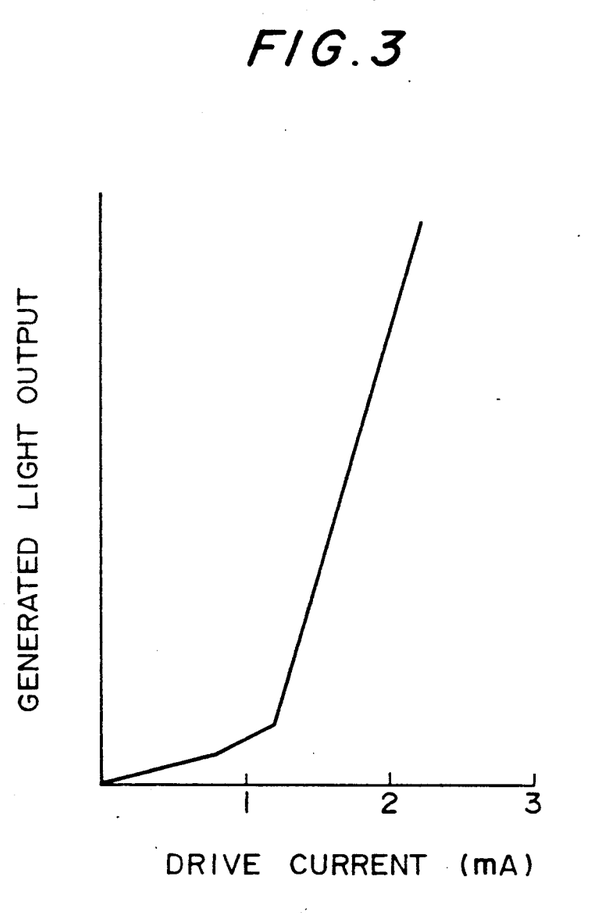
FIG. 3 is a graph illustrating the relationship between the drive current and the generated light output in the semiconductor laser shown in FIG. 1.

FIG. 3 shows the relationship between the drive current and the generated light output in the surface emission type semiconductor laser according to this embodiment. It will be apparent from this graph that the continuous generation can be accomplished at room temperature and the threshold is very low, or equal to one mA. Furthermore, the external differential quantum efficiency is increased and the characteristics of the laser is improved by restricting the reactive current.

If the cross-sectional shape of the column-like portion in the surface emission type semiconductor laser according to this embodiment of the present invention is of a circle or regular polygon such as square or regular octagon, a finely circular spot of beam can be provided. However, if this cross-sectional shape is of any configuration other than the above ones, such as rectangle or trapezoid, the cross-section of the laser beam will be ellipse or multi-mode. This is not desirable in applying the semiconductor laser to the devices.

TABLE 1

| Diameter of Column Cross-Section | Mode of Near Field Pattern |
| --- | --- |
| 2 μm | Zero-Order Basic Mode |
| 5 μm | Zero-Order Basic Mode |
| 10 μm | Zero-Order Basic Mode |
| 12 μm | First-Order Mode |

TABLE 1-continued

| Diameter of Column Cross-Section | Mode of Near Field Pattern |
| --- | --- |
| 15 μm | First-Order Mode |

Table 1 shows the relationship of near field pattern relative to the diameter of the cross-section of the column-like portion in the surface emission type semiconductor laser according to this embodiment of the present invention. It will be apparent therefrom that if the diameter is equal to or less than 10 μm, the generation is carried out in the basic mode.

It is preferred that the contact layer 108 in the surface emission type semiconductor laser according to this embodiment of the present invention is of a thickness equal to or less than 3.0 μm. This is because of reduction of the light absorption in the contact layer. Such a thickness is more preferably less than 0.3 μm because the element resistance is reduced and the external differential quantum efficiency is increased.

Figure 4:
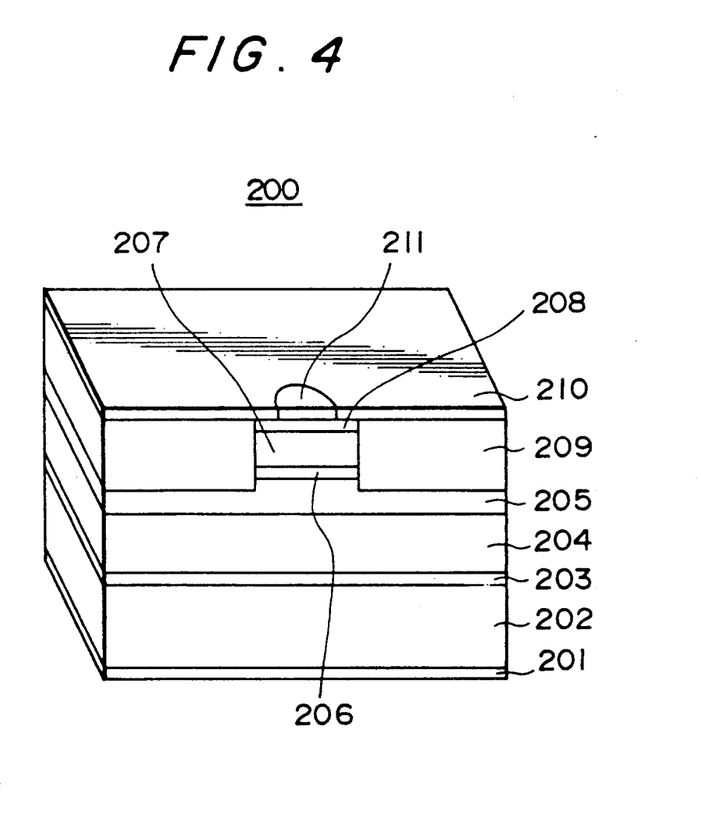
FIG. 4 is a perspective view, partially in section, of a light emitting portion of another embodiment of a semiconductor laser constructed in accordance with the present invention.

Referring now to FIGS. 4 and 5, there is shown a semiconductor laser 200 constructed in accordance with another embodiment of the present invention.

The semiconductor laser 200 comprises a substrate of n-type GaAs 202 over which a buffer layer of n-type GaAs 203 is formed. Over the buffer layer 203, there are formed 30 pairs of distribution reflection type multi-layer film mirror 204 which include an n-type AlAs layer and an n-type $Al_{0.1}Ga_{0.9}As$ layer and have a reflectivity equal to or higher than 98% against light rays having their wavelength substantially equal to 870 nm. On the multi-layer film mirror 204, there are sequentially formed a cladding layer of n-type $Al_{0.4}Ga_{0.6}As$ 205, an active layer of p-type GaAs 206, another cladding layer of p-type $Al_{0.4}Ga_{0.6}As$ 207 and a contact layer of p-type $Al_{0.1}Ga_{0.9}As$ 208, utilizing the epitaxial growth in the MOCVD process (see FIG. 5(a)). At this time, for example, the formation of these layers was carried out under such a condition that the temperature on growth is 700° C. and the pressure on growth is 150 Torr. and used organic metals such as TMGa (trimethyl gallium) and TMAl(trimethyl aluminum) as III-group materials, $AsH_3$ as V-group material, $H_2Se$ as n-type dopant and DEZn (diethyl zinc) as p-type dopant.

After growth, an $SiO_2$ layer 212 is formed on the top of the multi-layered structure by the thermal CVD process. By the use of the reactive ion beam etching process (RIBE process), the multi-layered structure is etched up to the middle of the cladding layer of n-type $Al_{0.4}Ga_{0.6}As$ 205, leaving a column-like light emitting portion covered with a hard baked resist layer 213 (FIG. 5(b)). The etching gas is a mixture of chlorine with argon under a pressure of $1 \times 10^{-3}$ Torr. The leading voltage used therein is equal to 400 V.

Figure 5A:
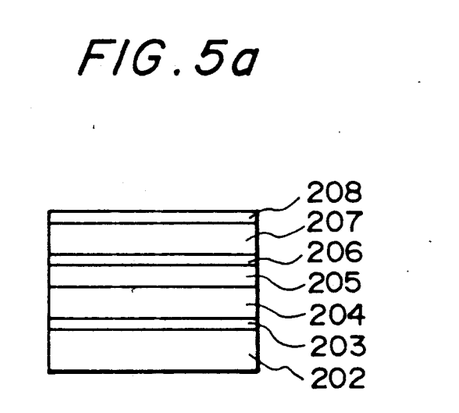
FIGS. 5a–5e are cross-sectional views of the semiconductor laser shown in FIG. 4, illustrating the process of making it.
Figure 5B:
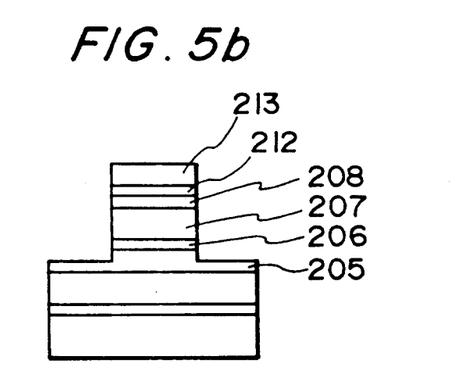
Figure 5C:
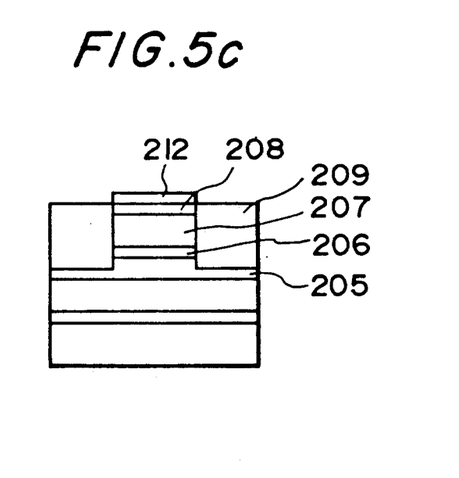
Figure 5D:
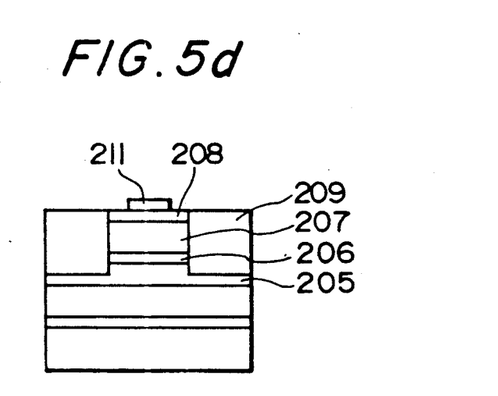
Figure 5E:
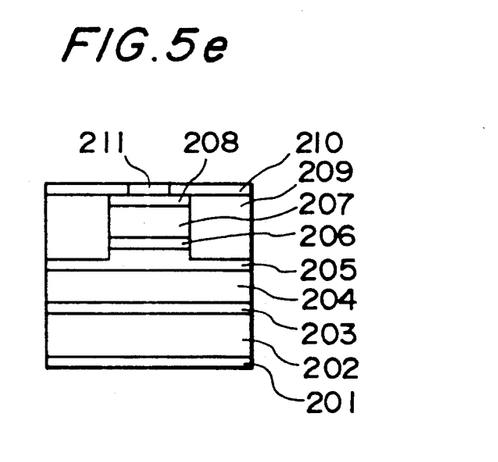

After the resist 213 has been removed, a layer of $ZnS_{0.06}Se_{0.94}$ 209 which is in lattice alignment with GaAs is then formed by causing this layer to grow around the column-like portion using the MBE or MOCVD process (FIG. 5(c)).

Four pairs of multi-layered dielectric film mirror of $SiO_2/a-Si$ 211 are then formed on the top of the column-like portion by the use of electron beam deposition. Dry etching is then used to remove a part of mirror 211, leaving a region slightly smaller than the diameter of the light emitting portion (FIG. 5(d)). The reflectivity of the multi-layered dielectric film mirror 211 is 94% for wavelength of 870 nm.

Thereafter, a p-type ohmic electrode 210 is deposited on all the top face except the multi-layered dielectric film mirror 211. An n-type ohmic electrode 201 is further deposited over the bottom face of the semiconductor substrate 202. In an atmosphere of $N_2$, the entire structure is alloyed at 420° C. to provide a surface emission type semiconductor laser (FIG. 5(e)).

The surface emission type semiconductor laser thus formed provides a very effective current restriction since the buried layer of $ZnS_{0.06}Se_{0.94}$ has a resistance equal to or higher than one GΩ and there is no injection current into the buried layer. Since it is not required that the buried layer is any multi-layered structure, it can be more easily grown with an increased reproductiveness from one batch to another. The utilization of the rib waveguide structure using the $ZnS_{0.06}Se_{0.94}$ layer having its refractive index sufficiently smaller than that of GaAs can realize a more effective light confinement with the covering type refraction waveguide structure in which the active layer is buried.

The active GaAs layer may be replaced by an active layer made of AlGaAs with the equivalent advantage. Even if the column-like portion is formed of any one of the other III-V group compound semiconductors, the equivalent advantage can be provided by selecting any suitable one of the II-VI group compound semiconductor to form the buried layer.

Figure 6:
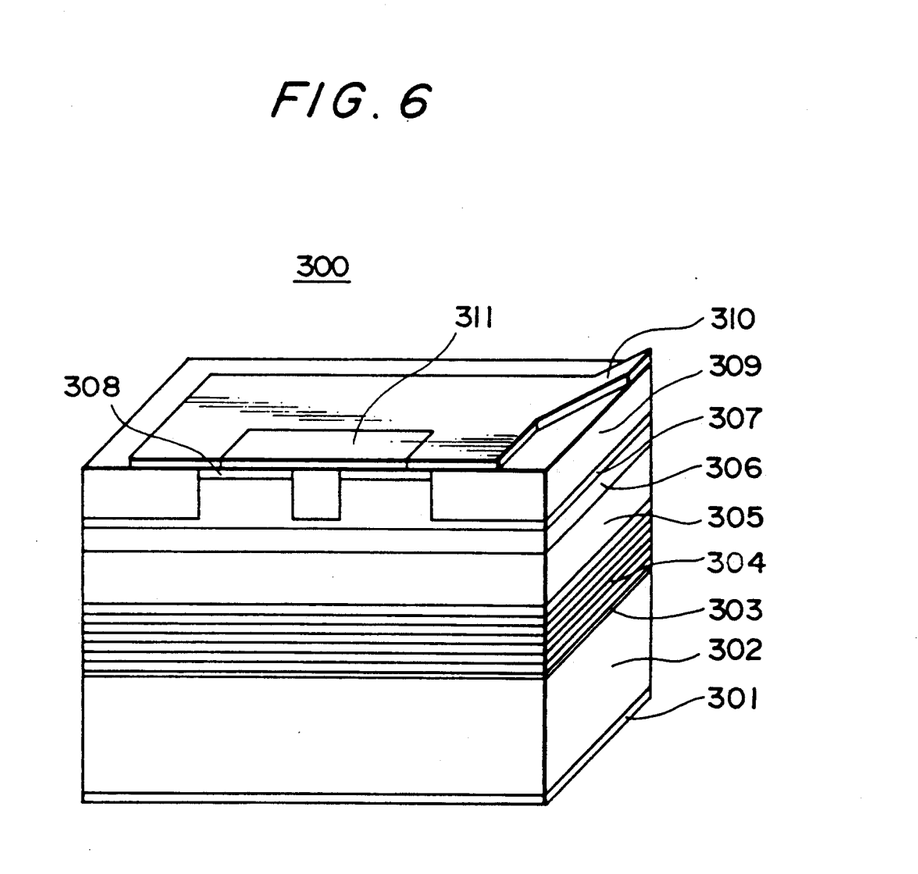
FIG. 6 is a perspective view, partially in section, of a light emitting portion of a surface emission type semiconductor laser constructed in accordance with the present invention, the semiconductor laser adapted to generate laser beams synchronized in phase.

Referring next to FIGS. 6 and 7, there is shown still another embodiment of a phase-synchronization type semiconductor laser 300 constructed in accordance with the present invention, which can increase the dimension of the emission spot.

The semiconductor laser 300 comprises a substrate of n-type GaAs 302 over which a buffer layer of n-type GaAs 303 is formed. Over the buffer layer 303, there are formed 25 pairs of distribution reflection type multi-layer film mirror 304 which include an n-type $Al_{0.9}Ga_{0.1}As$ layer and an n-type $Al_{0.2}Ga_{0.8}As$ layer and have a reflectivity equal to or higher than 98% against light rays having their wavelength substantially equal to $780 \pm 30$ nm. On the multi-layer film mirror 304, there are sequentially formed a cladding layer of n-type $Al_{0.5}Ga_{0.5}As$ 305, an active layer of p-type $Al_{0.13}Ga_{0.87}As$ 306, another cladding layer of p-type $Al_{0.5}Ga_{0.5}As$ 307 and a contact layer of p-type $Al_{0.15}Ga_{0.85}As$ 308, utilizing the epitaxial growth in the MOCVD process (see FIG. 7(a)). At this time, for example, the formation of these layers was carried out, for example, under such a condition that the temperature on growth is 720° C. and the pressure on growth is 150 Torr. and used organic metals such as TMGa (trimethyl gallium) and TMAl (trimethyl aluminum) as III-group materials, $AsH_3$ as V-group material, $H_2Se$ as n-type dopant and DEZn (diethyl zinc) as p-type dopant.

After the growth, a $SiO_2$ layer is formed on the top of the multi-layered structure in the atmospheric pressure by the thermal CVD process. A photoresist is then applied over the $SiO_2$ layer and baked at a raised temperature to form a hard baked resist. A further $SiO_2$ layer is formed over the hard baked resist by the EB deposition.

The respective layers formed on the substrate are then etched by the use of reactive ion etching process (RIE process). The $SiO_2$ layer formed on the hard baked resist 313 is first subjected to the conventional photolithograph to form a necessary resist pattern. This resist pattern is then used as a mask to perform the RIE process against the $SiO_2$ layer. For example, the RIE process may be carried out by using $CF_4$ gas under a pressure of 4.5 Pa and an input RF power of 150 W and by controlling the sample holder at 20° C. This $SiO_2$ layer is then utilized as a mask to etch the hard baked resist 313 by the RIE process which uses, for example, $O_2$ gas under a pressure of 4.5 Pa and an input power of 150 W and controls the sample holder at 20° C. At the same time, the resist pattern initially formed on the $SiO_2$ layer is also etched. In order to etch both the $SiO_2$ layer left in the pattern and the $SiO_2$ layer 312 formed on the epitaxial layer simultaneously, the etching is again performed by the use of $CF_4$ gas. By using the thin $SiO_2$ layer as a mask and performing the RIE process which is one of the dry etching processes against the hard baked resist 313, the latter may include side walls perpendicular to the substrate while maintaining the necessary pattern (FIG. 7(b)).

Figure 7A:
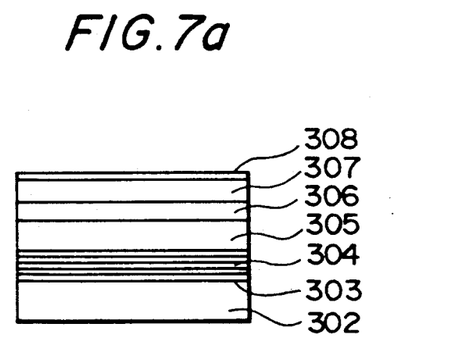
FIGS. 7a–7f are cross-sectional views of the semiconductor laser shown in FIG. 6, illustrating the process of making it.
Figure 7B:
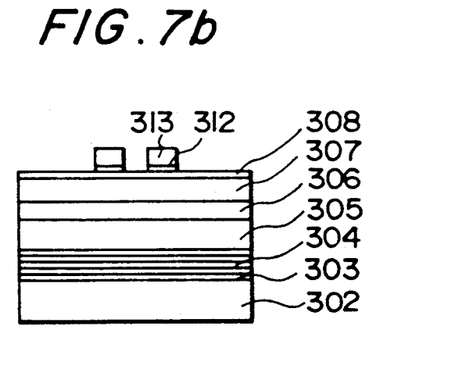
Figure 7C:
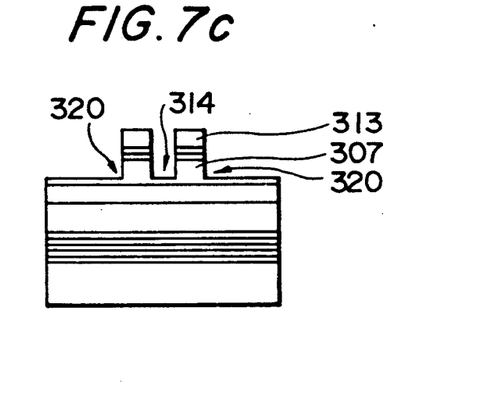

The hard baked resist 313 having such vertical side walls is used as a mask in the reactive ion beam etching (RIBE) process so that the cladding layer of p-type $Al_{0.5}Ga_{0.5}As$ 307 is etched up to its middle, leaving a plurality of column-like light emitting portions (FIG. 7(c)). The etching gas used herein is a mixture of chlorine with argon under a pressure equal to $5 \times 10^{-4}$ Torr. and a plasma generating voltage equal to 400 V. The RIBE process is carried out at the current density of ion equal to 400 $\mu A/cm^2$ on the etching sample while maintaining the sample holder at 20° C. The purpose of etching the cladding layer 307 up to its middle is to provide a refraction waveguide type rib waveguide structure for confining the horizontal injection carriers and light rays in the active layer such that a part of the light rays can be transmitted in the horizontal direction within the active layer.

If the RIBE process in which an ion beam is irradiated perpendicular to the hard baked resist 313 having its vertical side walls and the etching sample to etch them is used, the light emitting portions 320 arranged closed to each other can be separated from each other by a separation groove 314 and at the same time it is possible to produce a vertical light resonator which is required to improve the characteristics of the surface emission type semiconductor laser.

Figure 7D:
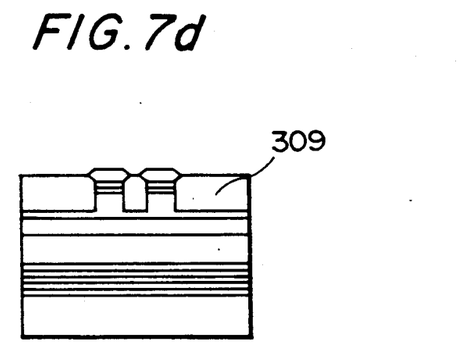
Figure 7E:
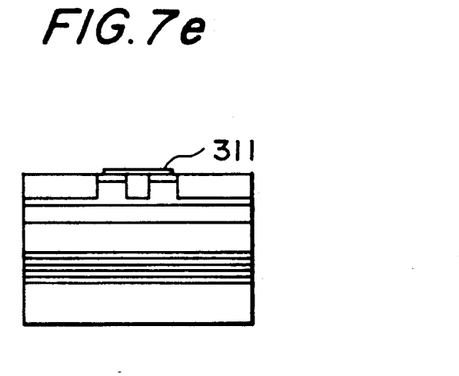
Figure 7F:
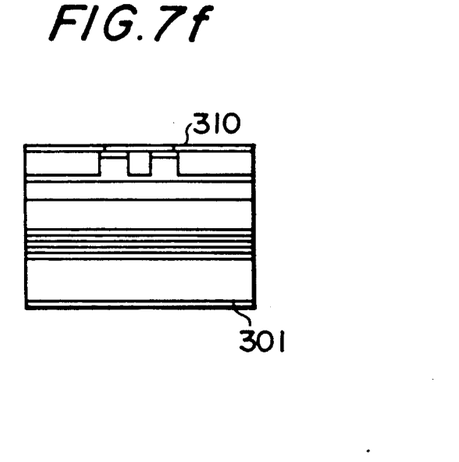

After the hard baked resist 313 has been removed, the MBE or MOCVD process is used to grow a layer of $ZnS_{0.06}Se_{0.94}$ 309 around the light emitting portions, such a buried layer serving as a II–VI group compound epitaxial layer which is in lattice alignment with $Al_{0.5}Ga_{0.5}As$ (FIG. 7(d)). This buried layer 309 is transparent for the generation wavelength of the surface emission type semiconductor laser 300.

Next, the $SiO_2$ layer and polycrystalline ZnSSe produced thereon are removed. Thereafter, four pairs of multi-layered dielectric film mirror 311 made of $SiO_2$/a-Si are formed on the top of the multi-layered structure by means of electron beam deposition. Dry etching is then used to remove a part of the mirror 311 (FIG. 7(e)). The reflectivity of the multi-layered dielectric film mirror at wavelength of 780 nm is 95% or more. Since the multi-layered dielectric film mirror 311 is also formed over the separation groove 314 buried with ZnSSe, a vertical resonator structure also is formed at the region between the adjacent light emitting portions. As a result, light rays leaked into the separation groove 314 effectively contributes to the laser generation. Since the leaked light rays are utilized, the emitted light can be synchronized with the phase at the light emitting portions 320.

Thereafter, a p-type ohmic electrode 310 is deposited on the top face except the multi-layered dielectric film mirror 311. An n-type ohmic electrode 301 is deposited on the bottom face of the substrate. The structure thus formed is alloyed at 420° C. in the atmosphere of $N_2$ to complete the surface emission type semiconductor laser 300 (FIG. 7(f)). The n-type ohmic electrode 310 on the exit side is formed to connect with the contact layer 308 in each of the light emitting portion.

Since the surface emission type semiconductor laser produced according to this embodiment utilizes the epitaxial ZnSSe layer 309 as a buried layer, it can have a resistance equal to or higher than one GΩ, which is higher than that of the prior art blocking structure using a counter bias at the p-n junction in the AlGaAs layer. This provides an optimum current blocking structure. Moreover, the light leaked from the light emitting portion 320 can be effectively utilized since the buried layer is made of a transparent material having less absorption for the generation wavelength of 780 nm.

FIG. 8 shows the arrangements of the surface emission type semiconductor lasers constructed respectively in accordance with the prior art and the present invention at the exit sides thereof and intensity profiles of NFP when the laser beam is generated. FIG. 8(a) shows that the resonators 620 of the prior art surface emission type semiconductor laser 600 shown in FIG. 12 are arranged close to one another up to a distance by which the resonators can be fully covered by the epitaxial layers of GaAlAs 607 and 608 connected with each other at the n-p junction, that is, a distance equal to about 5 μm. Although the exit face of the laser actually includes the multi-layered dielectric film mirror and the p-type ohmic electrode formed thereon, they are omitted in FIG. 8 for clear illustration. FIG. 8(b) shows an intensity profile of NFP between points a and b in FIG. 8(a). The prior art surface emission type semiconductor laser only provides a plurality of adjacent light spots even if a plurality of light emitting portions 620 are arranged close to each other.

Figure 8A:
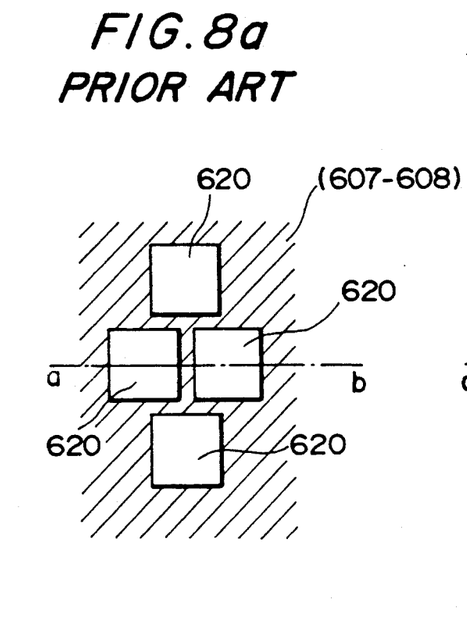
FIG. 8(a) shows the shape of the surface emission type semiconductor laser of the prior art on the exit side thereof.
Figure 8B:
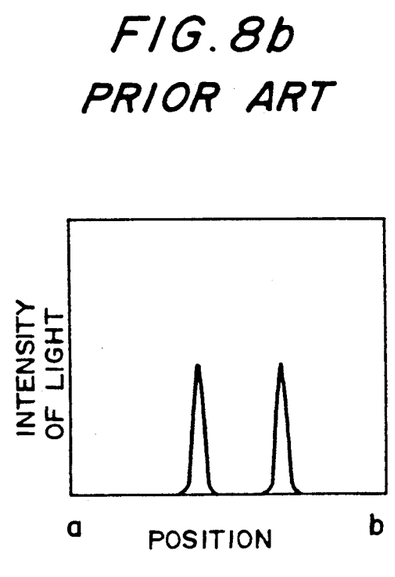
FIG. 8(b) shows an intensity profile in the near field pattern of the semiconductor laser shown in FIG. 8(a)
Figure 8C:
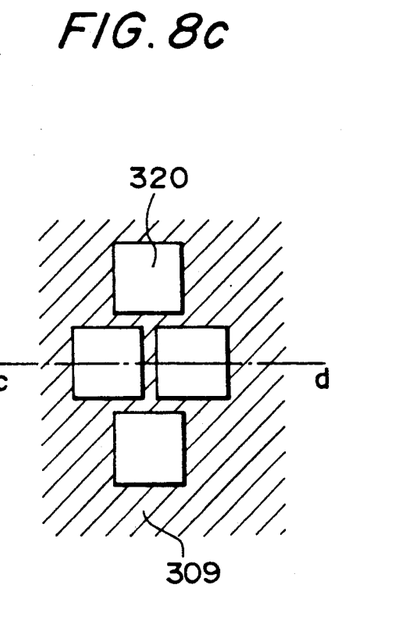
FIG. 8(c) shows the shape of the semiconductor laser of the present embodiment at the exit side.
Figure 8D:
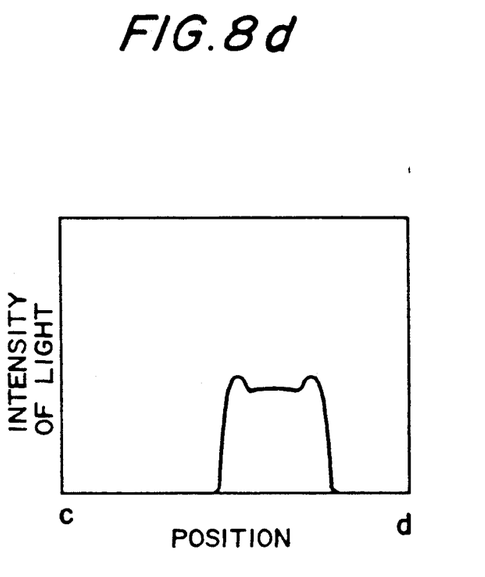
FIG. 8(d) shows an intensity profile of the near field pattern of the semiconductor laser shown in FIG. 8(c).
Figure 9A:
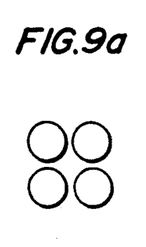
Figure 9B:
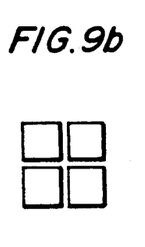
Figure 9C:
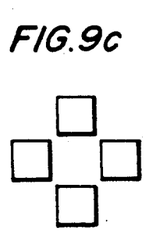
Figure 9D:
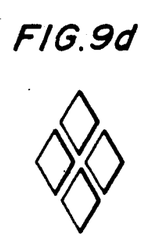
Figure 9E:
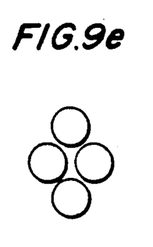
Figure 9F:
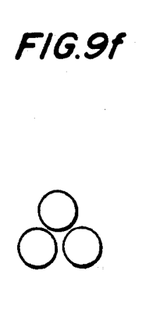
Figure 9G:
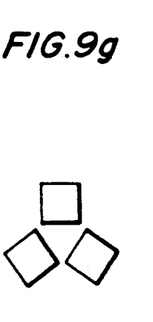
Figure 9H:
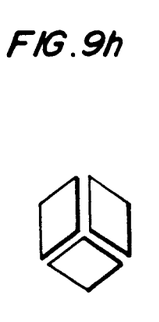
Figure 9I:
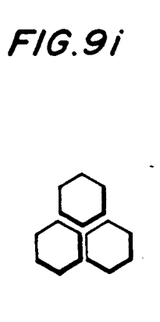
Figure 9J:
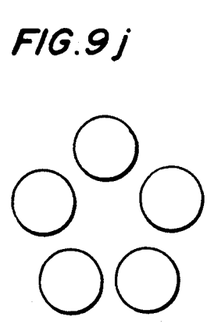
Figure 9K:
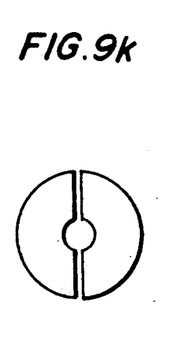
Figure 9L:
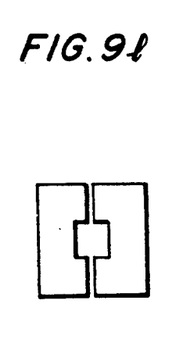
Figure 9M:
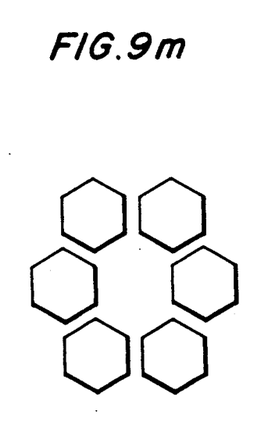
Figure 10A:
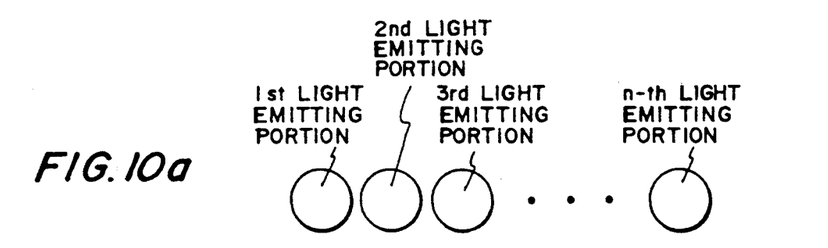
FIGS. 10(a) to (d) schematically illustrate various shapes of surface emission type semiconductor lasers constructed according to still further embodiments of the present invention at the exit sides thereof.
Figure 10B:
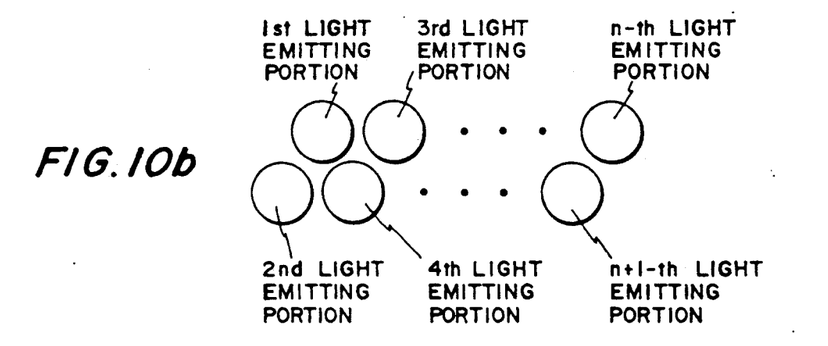
Figure 10C:
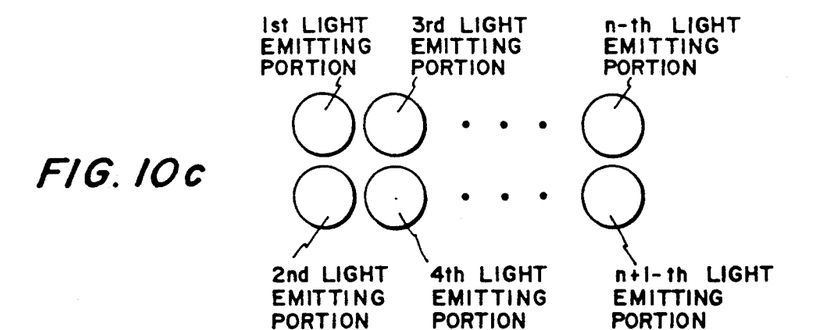
Figure 10D:
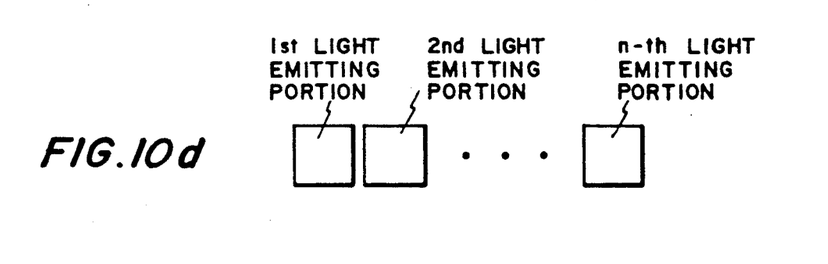

FIG. 8(c) shows the arrangement of the exit end of the surface emission type semiconductor laser constructed according to this embodiment wherein the separation groove is filled with a $ZnS_{0.06}Se_{0.94}$ layer 309 which formed by the vapor phase epitaxy method. Thus, the minimum width of the separation groove can be equal to one μm. FIG. 8(d) shows NFP between points c and d in FIG. 8(c). It will be apparent from this NFP that the light emission spot is enlarged since light rays exit also from above the separation groove 314. Since the adjacent laser beams are synchronized with each other in phase, the light output can be increased with an angle of radiation being equal to or less than one degree.

Table 2 shows the relationship between the width of the separation groove of the surface emission type semiconductor laser 300 and the order of transverse generation mode measured from NFP.

TABLE 2

| Width of Separation Groove | Mode of Near Field Pattern |
|---|---|
| 0.5 μm | Zero-Order Basic Mode |
| 1.0 μm | Zero-Order Basic Mode |
| 5.0 μm | Zero-Order Basic Mode |
| 10 μm | First-Order Mode |
| 20 μm | Higher-Order Mode |

If the width of the separation groove is less than 10 μm, the transverse generation mode of the laser synchronized in phase is in the basic mode. If the width is equal to or more than 10 μm, the laser will be generated in an order equal to or higher than one. In this case, the laser beam will be of an elliptic configuration with its increased angle of radiation. This is undesirable in all the applications. If the separation groove has a width less than 0.5 μm, the laser beam will not be circular.

Although the embodiments have been described as to a single optical resonator including a plurality of light emitting portions spaced away from one another, a plurality of such optical resonators may be formed on the same semiconductor substrate. If each of the optical resonators has a p-type ohmic electrode at its exit side, a laser beam from each optical resonator may be independently controlled with respect to ON, OFF and modulation.

Although the embodiments have been described as to the surface emission type semiconductor laser made of GaAlAs materials, the other III-V group compounds may be equivalently used in the present invention. Particularly, the generation wavelength may be varied by changing the composition of Al in the active layer of GaAlAs.

Although this embodiment has been described in connection with the structure shown in FIG. 6 and the light emitting portion shown in FIG. 8(c), the present invention is not limited to such an arrangement.

Figure 11A:
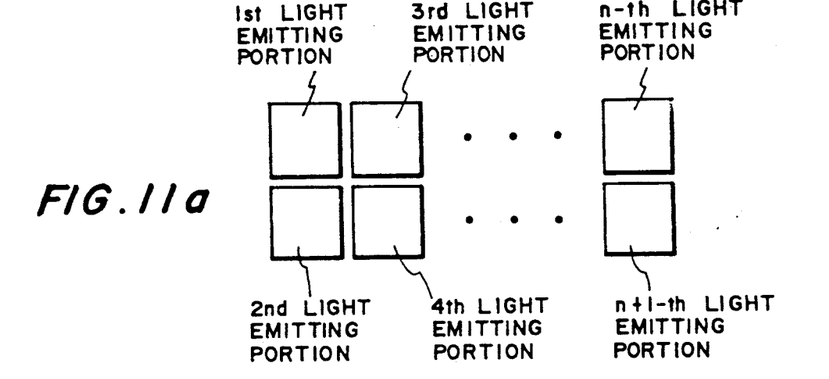
FIGS. 11(a) to (c) schematically illustrate various shapes of surface emission type semiconductor lasers constructed according to other embodiments of the present invention at the exit sides thereof.
Figure 11B:
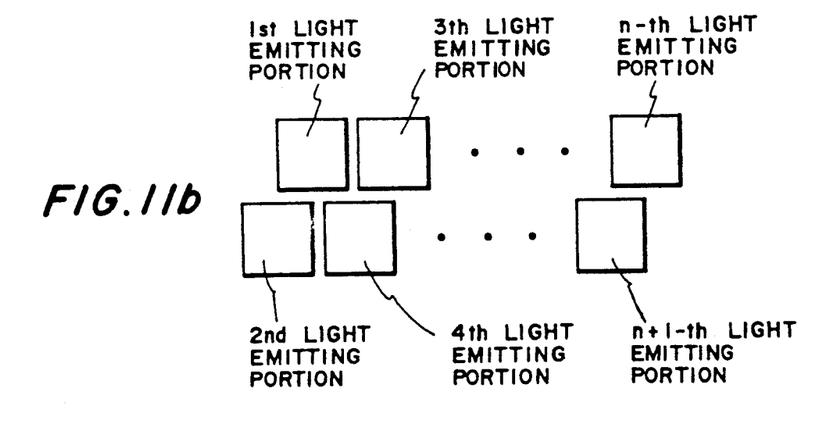
Figure 11C:
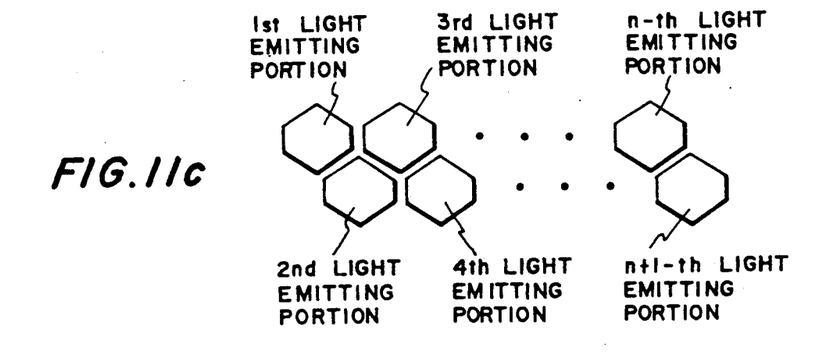

FIGS. 9 to 11 show the other embodiments of the present invention in which various configurations and arrangements of optical resonators and associated separation grooves in a plane parallel to the substrate as viewed from the exit side are schematically illustrated. FIGS. 9(a)–(j) and (m) represent line symmetry arrangements in which a plurality of column-like semiconductor layers each having a circular or regularly polygonal cross-section parallel to the substrate are formed. In any event, the light emitting spot formed by any one of such arrangements can have a dimension larger than that of a light emitting spot formed by a single light emitting portion. When it desired to provide a single circular cross-sectional laser beam having a relatively large diameter from the respective light emitting portions and separation groove, the cross-section of each of the light emitting portions may be any configuration other than circle or regular polygon. The essential requirement in the concept of the present invention is that a non-circular or non-polygonal line joining the outer edges of the light emitting portions arranged in line symmetry approximate to a circular or regularly polygonal configuration. So, the configurations shown in FIG. 9(k) and (l) are suitable for generating the laser beam having larger diamiter. Each of embodiments shown in FIGS. 10(a)–(d) and 11(a)–(c) includes light emitting portions of n in number and is advantageous in that it can produce a light emitting spot formed into any desirable size and form, in addition to the same advantages as in the embodiment of FIG. 6. In all the embodiments shown in FIGS. 10 and 11, a line beam may be provided by disposing a plurality of light emitting portions in row and/or column on a two-dimensional plane parallel to the substrate.

In the embodiment shown in FIG. 6, there may be produced a semiconductor laser which comprises a plurality of spaced p-type ohmic electrodes 310 equal in number to the light emitting portions 320, these electrodes 310 being connected with the contact layer 308.

In such a case, each of the light emitting portions will generate a beam having a circular cross-section which can be independently controlled in ON, OFF and modulation, these beams being synchronized with one another in phase.

It is to be understood that the surface emission type semi-conductor laser of the present invention may be equivalently applied to any desirable light source in various devices such as printer, copying machine, facsimile, display and so on.

We claim:

1. A surface emission type semiconductor laser for emitting a laser beam in a direction perpendicular to a semiconductor substrate in which said laser is formed, comprising an optical resonator means including a pair of reflecting mirrors having different reflectivities and a plurality of semiconductor layers between said reflecting mirrors, the semiconductor layers including at least a cladding layer in said semiconductor layers being formed into at least one column-like portion, and a II-VI group compound semiconductor epitaxial layer surrounding said at least one column-like portion.

2. A surface emission type semiconductor laser as defined in claim 1 wherein said II-VI group compound epitaxial layer is formed of a combination of two, three or four elements selected from II group elements, Zn, Cd and Hg and from VI group elements, O, S, Se and Te.

3. A surface emission type semiconductor laser as defined in claim 1 wherein said II-VI group compound semiconductor epitaxial layer has a lattice constant corresponding to that of said at least one column-like portion.

4. A surface emission type semiconductor laser as defined in claim 1 wherein the cross-section of said at least one column-like portion parallel to said semiconductor substrate is of a circular or regularly polygonal configuration.

5. A surface emission type semiconductor laser as defined in claim 4 wherein said at least one column-like portion has either a diameter or diagonal lines equal to or less than 10 μm in planes parallel to said semiconductor substrate.

6. A surface emission type semiconductor laser as defined in claim 1 wherein a semiconductor contact layer of said optical resonator means on an exit side thereof has a thickness equal to or less than 3.0 μm.

7. A surface emission type semiconductor laser as defined in claim 1 wherein said optical resonator means includes one column-like portion and wherein one of said reflecting mirrors on an exit side is formed opposite to an end face of said column-like portion within a range of said end face.

8. A surface emission type semiconductor laser as defined in claim 7 wherein said column-like portion does not include any active layer and wherein said column-like portion defines a rib waveguide type refraction waveguide structure.

9. A surface emission type semiconductor laser as defined in claim 7 wherein said column-like portion includes an active layer and wherein said column-like portion defines a buried type refraction waveguide structure.

10. A surface emission type semiconductor laser as defined in claim 1 wherein said optical resonator means includes separation groove means for separating a plurality of said column-like portions from one another, said II-VI group compound semiconductor epitaxial layer being located in said separation groove means to form a light emitting portion on each of said column-like portions, and wherein said separation groove means does not reach an active layer in said optical resonator means, whereby light beams from said light emitting portions can be synchronized with one another in phase.

11. A surface emission type semiconductor laser as defined in claim 10 wherein said separation groove means has side walls extending perpendicular to said semiconductor substrate.

12. A surface emission type semiconductor laser as defined in claim 10 wherein said II-VI group compound semiconductor epitaxial layer is transparent for the wavelength of the emitted laser beam and wherein the reflecting mirror on an exit side is formed over a region opposite to end faces of said column-like portions and to said II-VI group compound semiconductor epitaxial layer located in said separation groove means.

13. A surface emission type semiconductor laser as defined in claim 12 wherein said II-VI group compound semiconductor epitaxial layer is formed of any one selected from a group consisting of ZnSe, ZnS, ZnSSe, ZnCdS and CdSSe.

14. A surface emission type semiconductor laser as defined in claim 12 wherein a width of said separation groove means in a direction parallel to said semiconductor substrate is equal to or more than 0.5 μm and less than 10 μm.

15. A surface emission type semiconductor laser as defined in claim 12 wherein each of said column-like portions has a circular or regularly polygonal cross-section in a two-dimensional plane parallel to said semiconductor substrate and wherein said plurality of column-like portions are arranged in line symmetry in said two-dimensional plane to emit a laser beam having a circular cross-section.

16. A surface emission type semiconductor laser as defined in claim 12 wherein each of said column-like portions has a non-circular or non-polygonal cross-section on a two-dimensional plane parallel to said semiconductor substrate and wherein outer edges of said column-like portions are arranged to form substantially a circular or regularly polygonal profile, whereby a laser beam having a circular cross-section can be emitted from the semiconductor laser.

17. A surface emission type semiconductor laser as defined in claim 12 wherein a plurality of said optical resonator means each defined by a plurality of said column-like portions are formed on said semiconductor substrate to provide an independent electrode in each of said optical resonator means on an exit side, whereby a laser beam emitted from each of said optical resonator means and having a circular cross-section capable of forming an increased light emitting spot can be independently controlled in ON, OFF and modulation.

18. A surface emission type semiconductor laser as defined in claim 12 wherein said plurality of column-like portions are equidistantly arranged in row and/or column to provide a laser beam emitted therefrom in the form of a line beam.

* * * * *